(12) United States Patent
Lovett

(10) Patent No.: US 6,538,466 B1
(45) Date of Patent: Mar. 25, 2003

(54) BUFFER WITH STABLE TRIP POINT

(75) Inventor: Simon J. Lovett, Milpitas, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/915,823

(22) Filed: Jul. 26, 2001

Related U.S. Application Data

(62) Division of application No. 09/021,461, filed on Feb. 10, 1998, now Pat. No. 6,278,295.

(51) Int. Cl.[7] .......................................... H03K 19/0185
(52) U.S. Cl. .............................. 326/31; 326/32; 326/33; 326/34
(58) Field of Search ................................ 327/541, 543; 323/313, 315; 326/31–34, 63, 81

(56) References Cited

U.S. PATENT DOCUMENTS

| | | | |
|---|---|---|---|
| 4,736,123 A | 4/1988 | Miyazawa et al. | 307/443 |
| 4,791,323 A | 12/1988 | Austin | 307/475 |
| 4,857,763 A | 8/1989 | Sakurai et al. | 307/443 |
| 4,877,978 A | 10/1989 | Platt | 307/473 |
| 4,978,905 A | 12/1990 | Hoff et al. | 323/314 |
| 5,034,629 A | 7/1991 | Kinugasa et al. | 307/448 |
| 5,057,715 A | 10/1991 | Larsen et al. | 307/451 |
| 5,136,182 A | 8/1992 | Fawal | 307/296.8 |
| 5,157,284 A | 10/1992 | O'Connell et al. | 307/463 |
| 4,638,187 A | 3/1993 | Boler et al. | 307/451 |
| 5,305,282 A | 4/1994 | Choi | 365/230.08 |
| 5,321,319 A | 6/1994 | Mahmood | 307/443 |
| 5,386,153 A | 1/1995 | Voss et al. | 326/34 |
| 5,408,191 A | 4/1995 | Han et al. | 326/33 |
| 5,481,179 A | 1/1996 | Keeth | 323/315 |
| 5,495,184 A | 2/1996 | Des Rosiers et al. | 326/73 |
| 5,525,933 A | 6/1996 | Matsuki et al. | 327/309 |
| 5,554,942 A | 9/1996 | Herr et al. | 326/33 |
| 5,589,783 A | 12/1996 | McClure | 326/71 |
| 5,610,550 A | 3/1997 | Furutani | 327/543 |
| 5,869,997 A * | 2/1999 | Tomishima | 327/543 |
| 6,023,174 A * | 2/2000 | Kirsch | 326/34 |

FOREIGN PATENT DOCUMENTS

| | | | |
|---|---|---|---|
| JP | 5-67964 | 3/1991 | H03K/19/09 |
| JP | 3-132115 | 6/1991 | H03K/19/09 |

* cited by examiner

*Primary Examiner*—Michael Tokar
*Assistant Examiner*—Anh Q. Tran
(74) *Attorney, Agent, or Firm*—Christopher P. Maiorana, P.C.

(57) ABSTRACT

An input buffer having a stable trip point over at least process skew and supply voltage variations includes a first inverter stage; a second inverter stage; and an arrangement for compensating for process skew and supply voltage variations. The compensating arrangement is disposed both in the pull-up and pull-down paths, and increases the conductivity of the pull-up path and decreases the conductivity of the pull-down path when the DC trip point of the input buffer falls below nominal. The compensating arrangement also decreases the conductivity of the pull-up path and increases the conductivity of the pull-down path when the DC trip point rises above nominal. The compensating arrangement may include at least one device disposed in each of the pull-up and pull-down paths. The conductivity of these devices may then be controlled by a reference signal that swings about the DC trip point responsive to at least process skew corners and variations in supply voltage. Alternatively, the compensating arrangement may include a first and a second pair of devices of a first and second conductivity type connected in parallel and disposed in the pull-up and pull-down paths. The devices of the first conductivity type are connected at their control electrodes to the supply voltage and the devices of the second conductivity type are connected, at their control electrodes, to ground. The DC trip point is then stabilized at about nominal over at least process skew and variations in supply voltage.

20 Claims, 8 Drawing Sheets

BUFFER WITH STABLE TRIP POINT

This is a divisional of U.S. Ser. No. 09/021,461, filed Feb. 10, 1998 now U.S. Pat. No. 6,278,295.

BACKGROUND OF THE INVENTION

1. Field of the Invention

The invention generally pertains to the field of input buffers. In particular, the present invention relates to input buffers having a stable trip point and to reference voltage generators which are responsive at least to process skew and supply voltage variations and that may be used in such input buffers. The present invention also pertains to methods of stabilizing trip points of input buffers over at least supply voltage variations and process skew.

2. Description of the Related Art

Input buffers, such as TTL input buffers, are interface circuits used to convert Transistor-Transistor Logic (TTL) signal levels to Complementary Metal Oxide Semiconductor (CMOS) signal levels. An ideal input buffer would have a trip point set to a nominal Vcc/2 for a low input voltage level (VIL) of 0 volts and a high input voltage level (VIH) of Vcc volts. Moreover, the trip point of such an ideal input buffer would be utterly stable and would be insensitive to process parameter skew, variations in the supply voltage Vcc, temperature and other manufacturing and environmental variations.

The performance of currently available input buffers only approximates that of such an ideal input buffer. A number of factors affect this performance and act alone and in combination to cause the trip point to vary from its nominal value of Vcc/2. A stable trip point, however, is important whenever set up and hold issues arise. For example, when latching an address in a register, the address must remain stable during the set up time interval as well as during the hold time interval. If the clock pulse arrives too late, i.e., in violation of hold time, the address to be latched will have disappeared and no address will have been latched. Conversely, should the clock pulse arrive too early, the address will not have stabilized yet and again no valid data will be latched within the register. The situation also holds in asynchronous circuits wherein the clock signal is typically an active low Write Enable (WEB) signal. In this case, data is not latched to a register but rather if the address changes too close to the WEB pin being asserted, the previously asserted address may be inadvertently overwritten with the new data.

This set up and hold window is typically very short. For example, the Set Up time interval ($t_{sa}$) may be on the order of about 2.5 ns, whereas the Hold time interval ($t_{ha}$) may be on the order of about 0.5 ns. The total time interval during which the address to be latched must remain stable is the sum of these two intervals and is, therefore, only about 2.5 ns in duration. Variations in the input buffer trip point cut into this very narrow window and are, therefore, undesirable. The reason for this is illustrated in FIG. 7. The top signal in FIG. 7 is a clock pulse that is active on its positive going edge. In FIG. 7, the nominal trip point is set to be 1.25 volts. Then, a 250 mV variation in the trip point sets the new trip point at 1.5 V. This 250 mV variation, however, has a different effect upon positive going address pulses than it does on negative going address pulses. As shown in FIG. 7, the positive going address pulse will not reach the new 1.5 V trip point until later in time than will the negative going address pulse, the bottom signal in FIG. 7. In other words, the negative going address pulses will trip sooner than the positive going address pulse, thus making all falling edges faster and all rising edges slower. There is thus an asymmetry in the threshold point at which the signals trip.

If the slope of the pulse shown in FIG. 7 is 1V/ns, a variation in the trip point of 0.25 volts means 250 ps of time. From FIG. 7, it can be seen that the actual penalty for a 250 mV variation from the nominal trip point is 500 ps, as the positive going address pulse trips 250 ps after it would have at the nominal trip point, whereas the negative going address pulse trips 250 ps before it would have at the nominal trip point. Therefore, the Set Up and Hold window of 2.0 ns has been decreased by about 500 ps, fully one quarter of the available window. This decreased set up and hold window imposes additional and more severe timing constraints upon the operation and design of the input buffer, and may cause invalid data to be latched, depending on the magnitude of the variation in the trip point. Indeed, variations from the nominal trip point of greater magnitude quickly cut into the available set up and hold time interval. For example, a variation in the trip point that is only 50 mV greater than that illustrated in FIG. 7 reduces the Set Up and Hold window to only about 1.4 ns.

There are a number of reasons why the DC trip point of an input buffer would stray from nominal data book specifications. In the case of a CMOS buffer stage similar in design to that shown in FIG. 1, it has been found that variations in the magnitude of the Vcc supply and skew in a number of critical process parameters are responsible for about 70% and 20% of the trip point variation, respectively. The remaining 10% of the observed DC trip point variation is generally attributed to temperature fluctuations. The more important of these critical process parameters, in terms of contributing to trip point variations, are believed to be the critical dimensions, such as length and width, of the transistor gate (hereafter "Gate CD" or "Poly CD" if polysilicon is used for the gate), the field oxide critical dimensions (hereafter "FOM CD", for Field Oxide Mask Critical Dimensions) and the threshold voltage adjust dose (hereafter Vt adjust dose). Of these three process parameters, only the Vt adjust dose is believed to affect n channel and p channel FETs differently, although for narrow devices only, FOM CD can affect n and p channel devices differently, due to encroachment of field implants into the channel.

In submicron silicon gate processes, the speed of the device appears to be heavily dependent upon the gate etch step. When using polysilicon as the gate material, if the gate is under or over etched by as little as 10%, the speed of the device may be greatly affected. This is because the gate etch step defines the length of the channel L and the speed of the resultant device is proportional to the aspect ratio (W/L), where W is the width of the channel region and L its length. This (W/L) term affects the speed of the device, whether the device is operating in the linear region (also called the triode region) or is operating in the saturation mode. For example, the gate may have been over-etched during fabrication, resulting in shorter than expected n channel and p channel device channel lengths, thus causing these devices to have a greater Ids and speed than nominal.

The filed oxide is an isolation structure (generally a LOCOS or shallow trench isolation structure comprising silicon oxide) and defines the device width W of the (W/L) term by separating the active regions of CMOS devices. Variations in the FOM CD affect both n and p channel transistors.

The effects of the Vt adjust dose, however, are not shared equally among n channel FETs and p channel FETs. The Vt adjust dose raises the threshold voltage Vt by implantation of a p-type material such as boron into the channel region, before the polysilicon layer is formed. The boron dose is critical, as it has a direct effect upon Vt, which is directly related to the speed of the device. For example, a particular batch of wafers may have been given a slightly larger than nominal Vt adjust dose during fabrication. The p channel devices of such a batch may have a lower Vt then the n channel devices. A lower threshold voltage Vt results in higher drain to source current Ids for a given gate to source voltage Vgs. Higher Ids correlates directly with device speed.

The process parameters discussed above create so-called process corners in which p channel and n channel devices are termed slow, fast or typical. It is common to refer to these corners as ss, sf, ff and fs, where the first letter refers to the speed of the p channel device and the second letter refers to the speed of the n channel device. The fs corner, for example, refers to a situation wherein the p channel device is faster (higher Ids) than nominal and the n channel device is slower (lower Ids) than nominal. Likewise, the sf process corner refers to a slow p channel and a fast n channel device. Such a state might occur, for example, when the Vt adjust dose was lighter than it should have been, thus raising the threshold voltage Vt for the p channel device and lowering the Vt for the n channel device, making the p channel device slow (less Ids for a given Vgs) and the n channel device fast (more Ids for a given Vgs). Other process corner combinations are possible; including st, ts, ft and tf, where f signifies fast, s signifies slow and t denotes a typical device speed. The fs and sf corners are believed to have the greatest impact on the trip point skew of input buffers, as will be shown with reference to FIG. 1. The if, ss, st, ts, ft and tf process corners, while affecting the trip point of such input buffers, nevertheless have less impact thereon as do the fs and sf process corners, because of the relatively smaller disparity between the respective speeds between the p and n channel devices.

The skew in the process parameters, together with the variations in the Vcc supply, cause undesirable variations in the DC trip point of input buffers. What is needed, therefore, is an input buffer exhibiting increased stability over at least process parameter skew and variations in the supply voltage. What is also needed is a method of stabilizing input buffers, to reduce their sensitivity to variations in supply voltage and process skew corners.

SUMMARY OF THE INVENTION

It is, therefore, an object of the present invention to provide a buffer having a stable trip point.

It is yet another object of the present invention to provide a reference voltage generating circuit whose output swings about a nominal voltage responsive at least to process skew corners and variations in supply voltage.

It is a further object of the present invention to provide a method for stabilizing a trip point of an input buffer over at least process skew and variations in supply voltage.

In accordance with the above objects and those that will be mentioned and will become apparent below, the input buffer according to one embodiment of the present invention comprises:

an input stage, comprising at least one input node receiving a first signal, a first pull-up transistor, a first pull-down transistor, and an output node;

a control circuit configured to (i) couple the first pull-up transistor to a first supply voltage and/or decouple the first pull-up transistor from the first supply voltage, (ii) couple the output node to a second supply voltage and/or decouple the output node from the second supply voltage, or (iii) both (i) and (ii); and a stabilizing circuit comprising first and second transistors, each in series with at least one of the first pull-up transistor and the first pull-down transistor.

The stabilizing circuit may comprise (i) a first p-channel transistor in a pull-up path and (ii) a first n-channel transistor in a pull-down path, each being independently coupled to at least one source/drain terminal of at least one of the first pull-up transistor and the first pull-down transistor. An output stage may be included and configured to generate an output signal in response to a voltage at the output node. The stabilizing circuit may be configured to (i) increase a pull down current through the source/drain terminal of the first pull-down transistor in response to a reference signal, (ii) decrease a pull down current through the source/drain terminals of the pull-down transistor in response to the reference signal, or (iii) both (i) and (ii). The pull-down path may comprise a second n-channel transistor configured to (i) couple a first output of the stabilizing circuit to the output node in response to the first signal at the input node, (ii) decouple the first output of the stabilizing circuit from the output node in response to the first signal at the input node, or (iii) both (i) and (ii). The stabilizing circuit may be configured to (i) increase a pull-up current through a first output of the control circuit and through the source/drain terminal of the first pull-up transistor in response to a reference signal, (ii) decrease the pull-up current through the first output of the control circuit and through the source/drain terminal of the first pull-up transistor in response to the reference signal, or (iii) both (i) and (ii).

The stabilizing circuit may be configured to (i) increase a pull-up current through a first output of the control circuit and through the source/drain terminal of the first pull-up transistor in response to a reference signal, (ii) decrease the pull-up current through the first output of the control circuit and through the source/drain terminal of the first pull-up transistor in response to the reference signal, or (iii) both (i) and (ii). The pull-up path may comprise a second p-channel transistor configured to (i) increase a pull-up current through a second output of the stabilizing circuit and through the output node in response to the first signal at the input node, (ii) decrease the pull-up current through the second output of the stabilizing circuit and through the output node in response to the first signal at the input node, or (iii) both (i) and (ii).

The input stage may further comprise a second pull-up transistor in parallel with the first pull-up transistor, configured to (i) couple a first output of the control circuit to the output node in response to the first signal at the input node, (ii) decouple the first output of the control circuit from the output node in response to the first signal at the input node, or (iii) both (i) and (ii); and a second pull-down transistor in parallel with the first pull-down transistor, configured to (i) couple the second supply voltage to the output node in response to the first signal at the input node, (ii) decouple the second supply voltage from the output node in response to the first signal at the input node, or (iii) both (i) and (ii). The first p-channel transistor and the first n-channel transistor may be coupled in parallel between the output node and one source/drain terminal of the first pull-up transistor.

The reference voltage may be generated by a reference voltage generating circuit configured to compensate for at least (i) variations in the first supply voltage and/or the second supply voltage, (ii) variations caused by process skew, or (iii) both (i) and (ii), by varying the reference voltage in response thereto. The reference voltage may be generated by a reference voltage generating circuit, comprising a control circuit configured to couple a first supply voltage to a first node in response to a control signal; a first compensation circuit comprising a first p-channel device and a first n-channel device defining a second node therebetween, the first compensation circuit providing a compensation signal at the second node in response to (i) a second supply voltage and (ii) a signal at the first node; and a second compensation circuit comprising a second p-channel device and a second n-channel device defining an output node therebetween, the second compensation circuit providing a reference voltage at the output node in response to (i) one of the first and second supply voltages, (ii) the signal at the first node, and (iii) the compensation signal.

The first p-channel transistor and the first n-channel transistor may be coupled in parallel between the output node and one source/drain terminal of the first pull-down transistor. The stabilizing circuit may further comprise a second p-channel transistor and a second n-channel transistor, each being coupled in parallel between the output node and one source/drain terminal of the first pull-up transistor. The first p-channel transistor and the first n-channel transistor may be coupled in parallel to one source/drain terminal of the first pull-down transistor.

According to another embodiment, the reference voltage generating circuit according to the present invention comprises:

a control circuit configured to couple a first supply voltage to a first node in response to a control signal;

a first compensation circuit comprising a first p-channel device and a first n-channel device defining a second node therebetween, the first compensation circuit providing a compensation signal at the second node in response to (i) a second supply voltage and (ii) a signal at the first node; and a second compensation circuit comprising a second p-channel device and a second n-channel device defining an output node therebetween, the second compensation circuit providing a reference voltage at the output node in response to (i) one of the first and second supply voltages, (ii) the signal at the first node, and (iii) the compensation signal.

One of the first p-channel device and the first n-channel device maybe configured as a resistive device, and the other of the first p-channel device and the first n-channel device may be configured as a diode. One of the second p-channel device and the second n-channel device may be configured as a resistive device, and the other of the second p-channel device and the second n-channel device may comprise a transistor having a gate receiving the compensation signal.

According to another embodiment, the method of stabilizing a trip point of a buffer over variations in supply voltage and/or processing, the buffer comprising a pull-up path and a pull-down path, each path having a conductivity according to the present invention includes the steps of:

generating a reference voltage from first and second compensation circuits, each of the compensation circuits comprising a p-channel device and an n-channel device defining a node therebetween, the second compensation circuit providing the reference voltage at its node in response to at least one supply voltage and a signal at the node of the first compensation circuit, such that the reference voltage changes when the trip point differs from a nominal voltage; and modulating at least one of the conductivities in response to a change in the reference voltage.

A step of generating the signal at the node of the first compensation circuit in response to at least one supply voltage and a control signal may be carried out, and the p-channel device and the n-channel device may be configured as resistive and/or diode-connected devices.

BRIEF DESCRIPTION OF THE DRAWINGS

For a further understanding of the objects and advantages of the present invention reference should be made to the following detailed description, taken in conjunction with the accompanying figures, in which.

DESCRIPTION OF THE PREFERRED EMBODIMENTS

Figure 1:
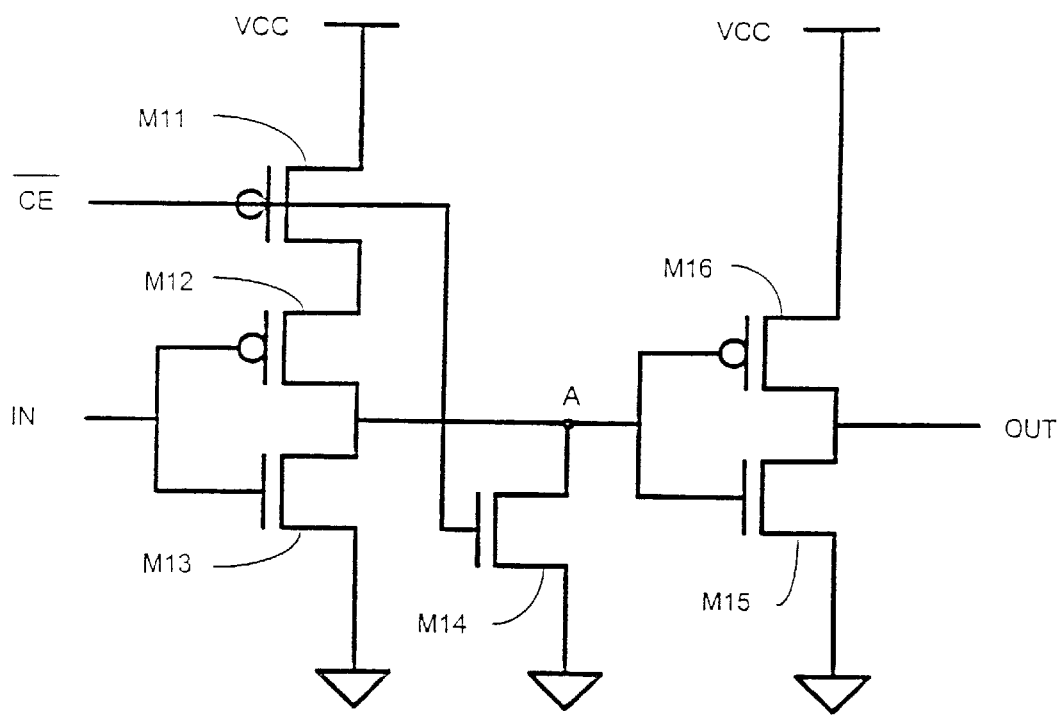
FIG. 1 is a circuit diagram of a CMOS input buffer.

FIG. 1 shows a circuit diagram of an input buffer for converting TTL signal levels to CMOS signal levels. M11, M12, M13 and M14 form a CMOS NOR gate. The CEB signal, active low, enables a sleep mode whereby the circuit consumes little current. When CEB is high, M11 turns off and node A floats unless driven by M14. Transistor M14, however, conducts when CEB is high, pulling the input of the inverter consisting of M15 and M16 to ground level. This causes p channel M16 to conduct, bringing the output OUT approximately to Vcc. When the CEB signal is low and the input IN is low, M11 and M12 conduct, pulling node A high. As node A is high, M15 conducts and OUT is pulled to ground. Alternatively, when CEB is low and IN is high, M11 conducts but is left floating, M13 conducts, pulling node A to ground, causing M16 to conduct, and bringing OUT to Vcc.

Were the input buffer of FIG. 1 ideal, it would be unaffected by process skew, Vcc variations or other factors. However, such is not the case. For example, the FOM CD, the Poly CD or the Vt adjust dose can and do cause the DC trip point of this circuit to deviate from the nominal trip point.

For example, at the fs process corner, the p channel devices M11, M12 and M16 are fast, whereas the M13, M14 and M15 are slow. This causes the circuit to stray from the ideal situation wherein the Ids along the pull-up path (M12, M11) is equal to the Ids along the pull-down path (M13 to ground). Indeed, at the fs process corner, the p channels M12, M11 and M16 have greater conductivity than that of n channel devices M13 and M15. By equating the saturation current expressions of the p and n channel devices, it can be seen that, in the case wherein the process is at the fs corner, the switching voltage for the buffer is raised from nominal. The situation is reversed at the sf process corner, wherein the conductivity of the n channel devices is greater than that of the p channel devices, for a given Vgs. This, in turn lowers the DC trip point of the first inverter stage.

However, as alluded to above, process parameters are not the only factors affecting the trip point of such an input buffer. Should Vcc increase, for example, from 3.3 V (its nominal value) to 3.7 V (its maximum value), the source to gate potentials of M11, M12 and M16 are increased, thus increasing the pull-up current relative to the pull-down current. Therefore, the current along the pull-up path (proportional to the Vgs-Vt term of the saturation current expression) is different than the current along the pull-down path. Under these conditions, the trip point of the device is raised from nominal. Conversely, should the Vcc supply dip from 3.3 V to, for example, 3.0 V, the Vgs potential of the p channels M11, M12 and M16 will decrease and tend reduce the conductivity of the drain to source channel, causing it to conduct less current. In this case, the pull-down paths along M13 and M15 are stronger, in terms of Ids, than the pull-up path along M16. This causes the trip point of the input buffer of FIG. 1 to decrease from its nominal value. For at least the above-discussed reasons, the input buffer of FIG. 1 exhibits about a 550 mV to 600 mV DC trip point range at Vcc=3.3, a temperature range of 0 to 125° C. and over all process corners.

Figure 2:
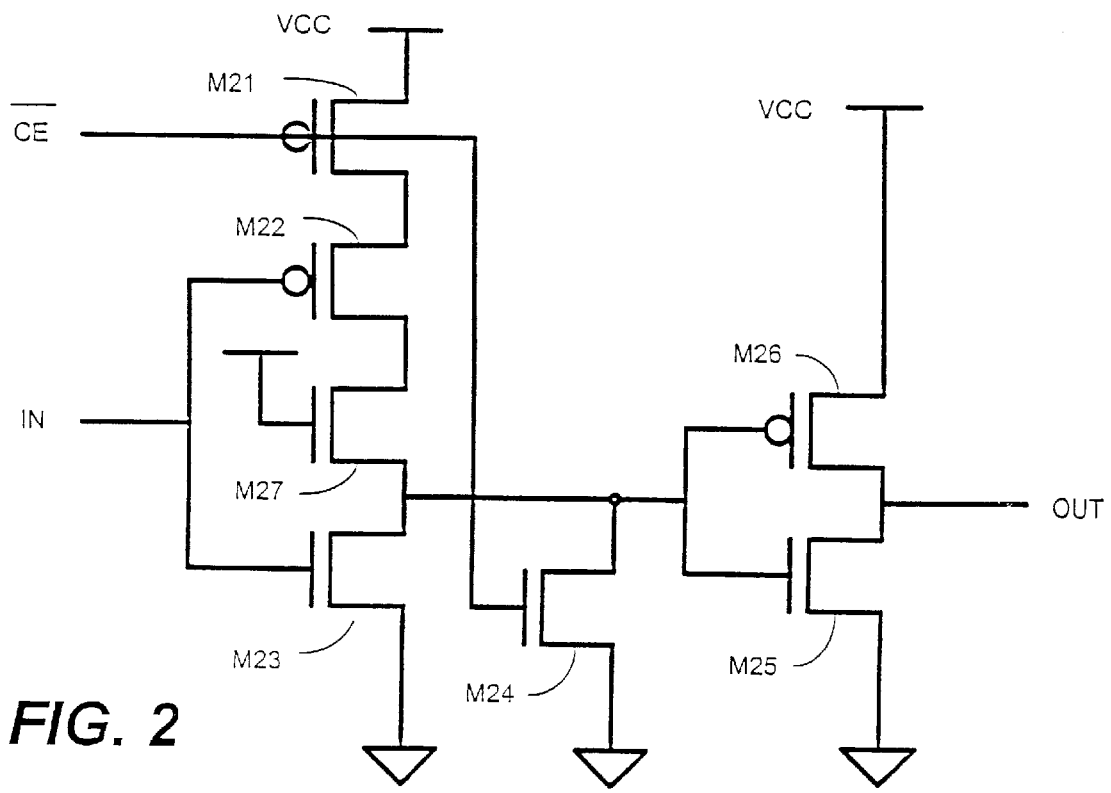
FIG. 2 is a circuit diagram of a variation of the input buffer shown in FIG. 1.

In an effort to reduce this rather large DC trip point range, the circuit of FIG. 2 has been proposed. The circuit of FIG. 2 is identical to the circuit of FIG. 1, but for the presence of n channel FET M27. As was seen with respect to FIG. 1, the trip point is set by both the n and p channel transistors. It is desirable to design CMOS inverter circuits so as to provide equal output current driving capability in both directions (pull-up and pull-down). However, process skew tends to change the n and p channel characteristics, which results in a departure from nominal performance. To reduce the effect of process skew on the inverter circuit of FIG. 1, n channel M27 is added, its gate tied to the Vcc voltage source, as shown in FIG. 2. Thus, M27 is always on and conducting. To achieve consistent performance at the process corners, M27 is selected so as to have a large on resistance. This is achieved by selecting the (W/L) ratio of M27 to be small and the (W/L) ratio of M22 large, since the current Ids, in saturation mode, is given by the equation:

$$Ids = K(Vgs-Vt)^2 \qquad (eqn. 1)$$

where $K_n = \frac{1}{2}\mu_n Cox(W/L)$ and $K_p = \frac{1}{2}\mu_p Cox(W/L)$. Therefore, by making the (W/L) ratio small, a larger on resistance is achieved. Therefore, as between the resistances of the transistors M22 and M27, the resistance of the transistor M27 will dominate in the pull-up path, and the net result will be the large resistance of the n channel transistor M27 in series with the smaller on resistance of the p channel transistor M22. Therefore, the circuit of FIG. 2 will be less sensitive to process skew corners such as the fs corner. Indeed, the trip point will be mostly determined by the two n channel transistors M27 and M23 and will be relatively unaffected by the p channel transistor M22. Since the n channel transistors dominate, the fs corner is equivalent to the ss corner and the two n channel transistors should track each other across process corners. Likewise, for the sf corner, the n channel transistor M27 will dominate the pull-up path and the sf corner will be equivalent to the ff corner and the n channel transistors should track over the process corners.

Figure 3:
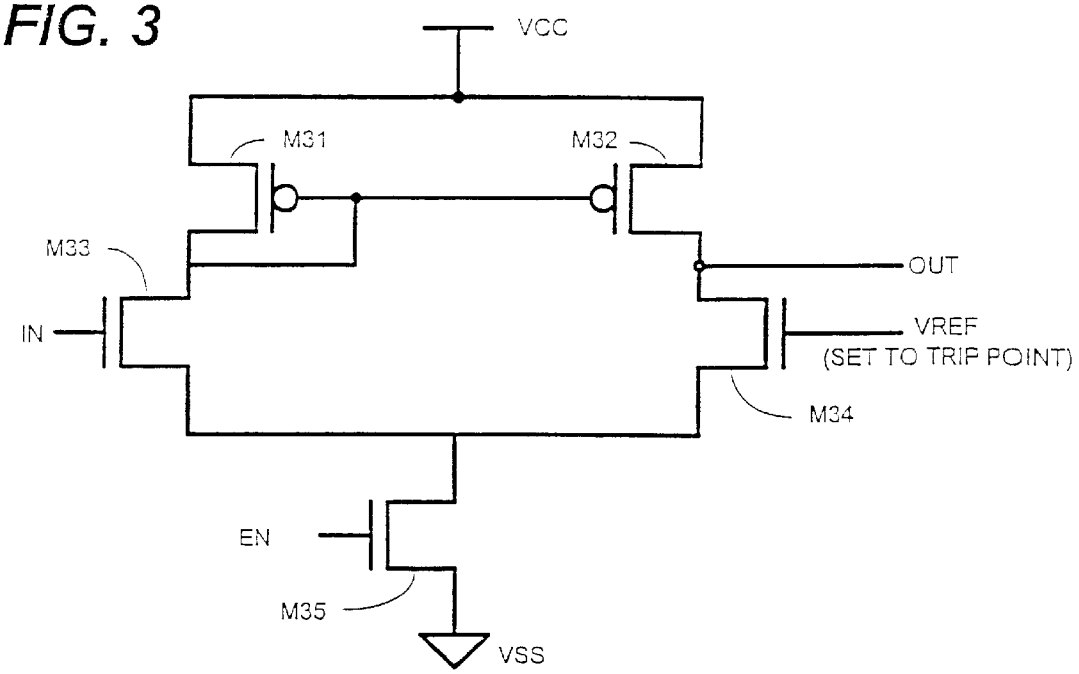
FIG. 3 is a circuit diagram of an input buffer having a differential amplifier configuration.

FIG. 3 shows yet another proposed circuit for a TTL input buffer. This circuit is configured as a differential amplifier utilizing a reference voltage Vref set to the desired trip point. This well known circuit works well as long as Vref is stable and does not vary significantly from the target DC trip point, due to Vcc variations, process skew or temperature variations.

Figure 4:
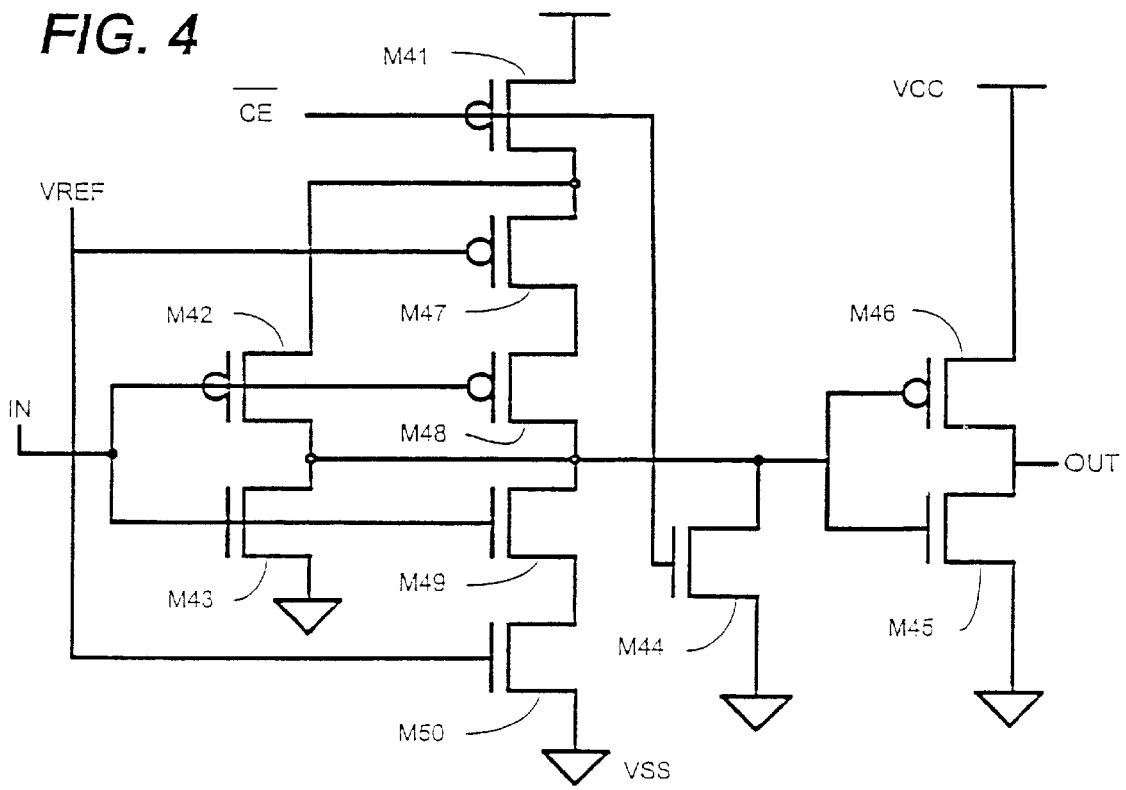
FIG. 4 is a circuit diagram of an input buffer having a stable trip point according to an embodiment of the present invention.
Figure 5:
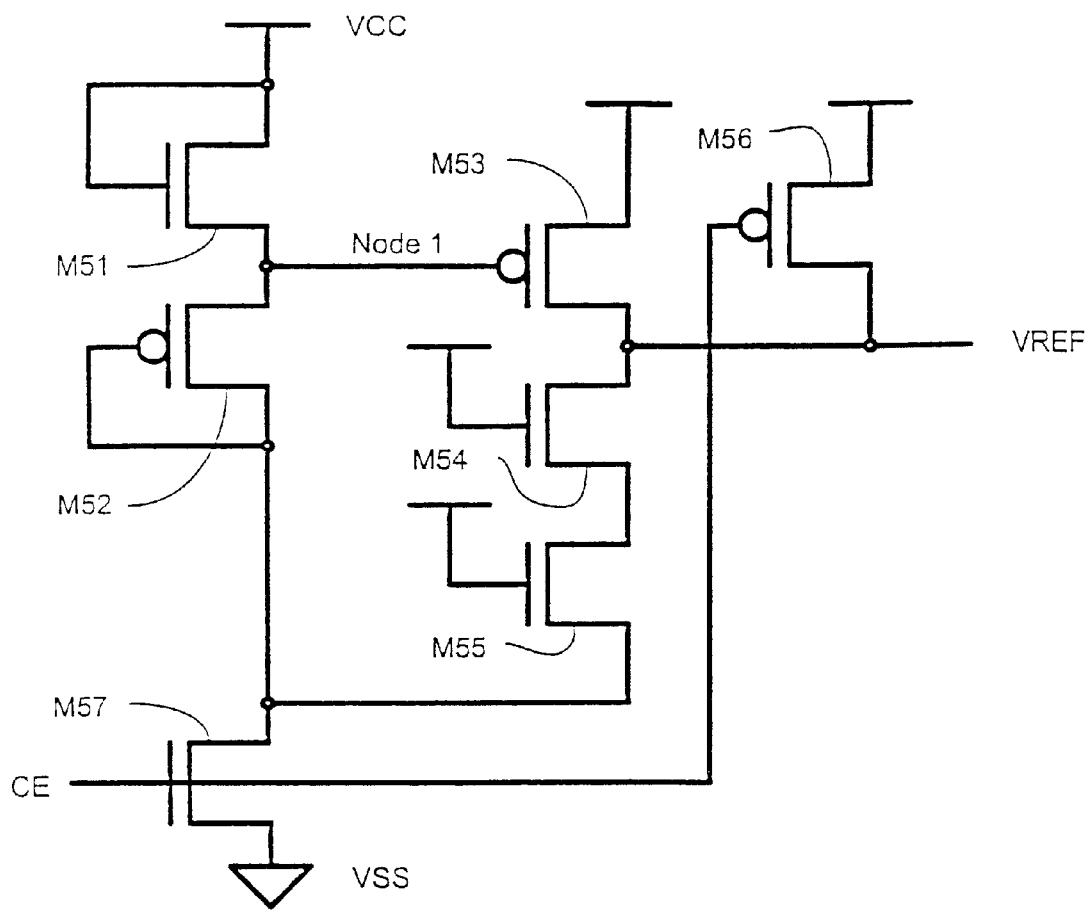
FIG. 5 is a circuit diagram of an embodiment of a circuit according to the present invention for generating a reference voltage Vref that is responsive at least to supply voltage variations and to process skew corners.

FIGS. 4 and 5 show a preferred embodiment of the input buffer having a stable trip point according to the present invention. FIG. 4 shows an embodiment of the input buffer according to the present invention, whereas FIG. 5 shows one embodiment of a reference voltage generating circuit that may be utilized in conjunction with the circuit of FIG. 4.

Turning first to FIG. 4, a first inverter stage includes p channel transistor M42 in the pull-up path and n channel transistor M43 in the pull-down path, their respective control or gate terminals being connected to the input IN. The positive supply Vcc, in circuits 4 and 5 may be at 3.3 volts, whereas the Vss terminal may be maintained at ground. Of course, other voltages may be utilized for Vcc and Vss. The drains of M42 and M43 are connected to the second inverter stage including p channel transistor M46 in the pull-up path and n channel transistor M45 in the pull-down path. The output of the buffer according to the present invention is taken at the drains of M45 and M46, at the OUT terminal. The CEB signal, active low, enables a sleep mode in which the circuit consumes little power. CEB is tied to the gate of p channel transistor M41, the source of which is connected to the Vcc power supply. CEB is also connected to the gate of n channel transistor M44, whose drain is connected to the gates of M45 and M46 (together forming an output stage) and whose source is tied to the ground potential. M41 and M44 together may be considered to be a control circuit configured to couple and/or decouple one of the transistors (e.g. pull-up transistor M48) of an input stage (including e.g. M48 and M49) to a first supply voltage (e.g. Vcc). Likewise, the control circuit may be configured to couple and/or decouple an output node (e.g. the node between M48 and M49) of the input stage including M48 and M49.

According to the present invention, the pull-up path includes additional devices to compensate for the effects of Vcc variations and process skew. The circuit of FIG. 4 includes means, disposed in both the pull-up and pull-down paths, for compensating for at least process skew and supply voltage variations. Indeed, in FIG. 4, a stabilizing circuit including series connected p channel transistors M47 and M48 are connected between the drain of M41 and the output of the first inverter stage, namely the drains of M42 and M43. Transistors M48, M47 and M41 form a compensating pull-up path. Alternately, the source of M47 may be connected to Vcc directly, without the intervening M41 transistor. Indeed, the transistors M41 and M44, controlled by CEB, are optional, and their absence in no way diminishes the core functionality of the present invention. Two additional devices, namely series connected n channel transistors M49 and M50 form a compensating pull-down path. As shown in FIG. 4, the drain of M49 is connected to the drains of the constituent transistors of the first inverter stage, namely M42 and M43. The source of n channel transistor M50 is tied to ground. Whereas the gates of transistors M48 and M49 are controlled by the IN signal, the control terminals or gates of transistors M47 and M50 are controlled by the reference voltage Vref.

Figure 10:
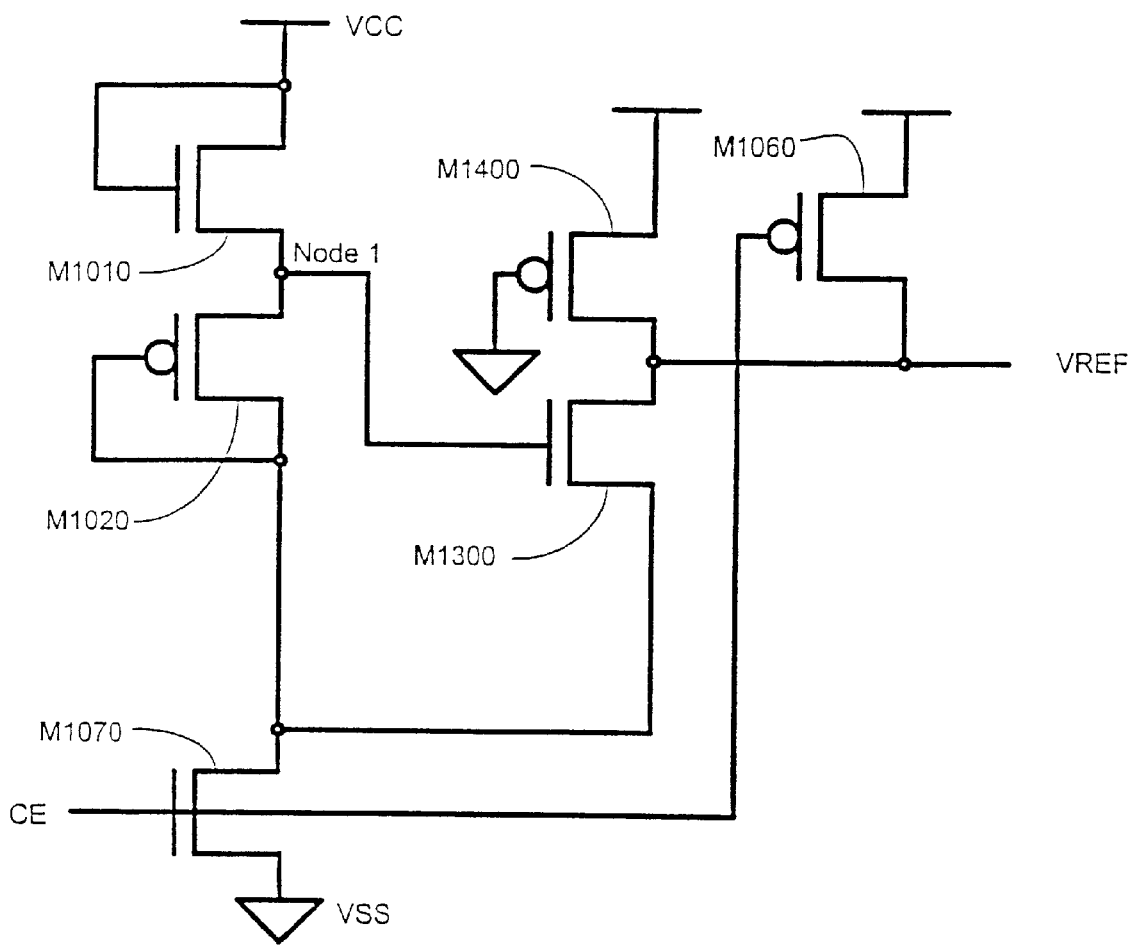
FIG. 10 is a circuit diagram of an alternative embodiment of the reference voltage generating circuit according to the present invention shown in FIG. 5.

Vref may be generated, for example, by the reference voltage generating circuit according to the present invention shown in FIG. 5. An alternative embodiment of the circuit of FIG. 5 is shown in FIG. 10. The reference voltage generating circuit of FIG. 5 includes an n channel transistor M57 having a source/drain terminal tied to a first voltage supply (e.g. ground or Vss) and a gate receiving a control signal (e.g. Chip Enable or CE). The reference voltage generating circuit according to the present invention may also include a p channel transistor M56 having one source/drain terminal connected to a second voltage supply (e.g. Vcc) and one source/drain terminal connected to the output Vref. The gate of M56 may receive a control signal (e.g. CE). Together, M57 and M56 form a control (e.g. power down) circuit. The control circuit may be configured as a logical NOR, a logical NAND, or may be absent altogether, depending upon the standby power constraints and the power up speed requirements of the device in question. N channel Transistor M51 has its drain and gate connected to Vcc. Thus, M51 is always on and always operates in saturation mode, as the saturation mode equation for n channel MOSFETS is defined as operation wherein the expression $$|Vds| \geq |Vgs-Vt| \qquad \text{(Eqn. 2)}$$

holds true. The source of M51 is connected to the source of p channel transistor M52. The gate and drain terminals of M52 are connected to the drain of transistor M57. Therefore, M52 always conducts in the saturation mode, as the saturation mode equation for p channel MOSFETS is defined as operation wherein the expression $$|Vds| < |Vgs-Vt| \qquad \text{(Eqn. 3)}$$

holds true. The source terminal of M51 is connected to the gate of p channel transistor M53 whose source is connected to Vcc. The drain of M53 is connected to the output Vref and to the drain of n channel transistor M54. M54 is connected in series with n channel transistor M55 whose source is connected to the drains of M52 and M57. The gates of M54 and M55 are each tied to Vcc. M54 and M55 are, therefore, always on.

An alternative embodiment of the circuit of FIG. 5 is shown, in FIG. 10. The circuit shown in FIG. 10 replaces the transistors M53 and M54–M55 with equivalent n and p channel devices, respectively. In FIG. 10, the gate of n channel M1300 is connected to Node 1 and its source connected to the drain of M1070. M1010, M1020, 1060 and M1070 correspond to and are connected as are M51, M52, M56 and M57 of FIG. 5, respectively. M1010 and M1020 together form a first compensation circuit and provide a compensating signal at Node 1. M54 and M55 of FIG. 5 are replaced, in FIG. 10, by grounded gate p channel transistor M1400. The source of M1400 is connected to the supply voltage Vcc. M1400 may be replaced by two equivalent series-connected transistors, in the manner shown relative to FIG. 5 with M54 and M55. The drains of M1300 and M1400 are connected together, from which point the reference voltage Vref is taken. M1400 and M1300 together form a second compensation circuit, and define an output node therebetween. The control (e.g. power down) circuit including M1070 and M1060 is similar to the control circuit including M57 and M56 shown in FIG. 5. The gates of M1070 and M1060 receive a control signal (e.g. CE), as described relative to FIG. 5.

The following will describe the operation of the input buffer of FIG. 4 and the operation of the reference voltage generating circuit of FIG. 5, with respect to both Vcc supply voltage variations and process skew compensation. Particular attention will then be given to design considerations for both the reference voltage generating circuit of FIG. 5 and the input buffer of FIG. 4.

1. Compensation for Vcc Variations

Power supply voltages are typically quoted on data sheets as a nominal voltage plus or minus some percentage variation. A power supply of 3.3V+−10% is typical for commercial modern semiconductor devices. Thus, the power supply voltage may vary from approximately 3V to approximately 3.7V. As Vcc increases, the gate to source voltage Vgs for M42 in FIG. 4 is increased, thus increasing the current in the pull-up path including M42 and M41. This increased pull-up current increases the DC trip point of the inverter stage including M42 and M43. To maintain a stable DC trip point, however, requires some form of compensation to offset this tendency of the DC trip point to increase with increasing Vcc. This compensation, according to the present invention, is controlled by the Vref signal that tends to increase responsive to an increasing Vcc to decrease the pull-up current through M41, M47 and M48 and increase the pull-down current through M49 and M50. Thus, an increasing Vref compensates for an increasing Vcc. Conversely, as Vcc decreases, the gate to source voltage Vgs of M42 decreases, which tends to decrease the current in the pull-up path, which, in turn, decreases the DC trip point of the buffer. To compensate for this decrease in Vcc and to maintain a stable trip point, Vref is caused to decrease. This increases the current in the pull-up path and decreases the current in the pull-down path, as the Vgs of M47 is decreased and the Vgs of M50 is increased, rendering M47 less conductive and M50 more conductive. Therefore, Vref also tracks Vcc as it decreases and causes the input buffer connected thereto to compensate for a decreasing Vcc. Indeed, the overall DC trip point of the buffer according to the present invention is set by the combined pull-up strengths of M42, M41, M47, M48 and pull-down strengths of M43, M49, M50, the Vref signal adjusting this overall trip point over corners and Vcc variations. The reference voltage Vref, therefore, can be said to modulate the conductivity of the pull-up and pull-down paths of the input buffer of FIG. 4 by controlling the conductivity of devices in the pull-up and pull-down paths.

With reference to FIG. 5, Vref tracks changes in Vcc by an amount equal to some fraction of the change in the Vcc voltage. As is apparent from inspection of FIG. 5, the change in the Node 1 voltage, in terms of change in Vcc, is equal to about the change in the Vcc voltage times the ratio of the conductivities of M52 and M51. Quantitatively, for a given change in the power supply voltage of ΔVcc, the voltage at node 1 in FIG. 5 changes by:

$$\frac{\Delta Vcc \mu_{M52}\left(\frac{L}{W}\right)_{M52}}{\mu_{M51}\left(\frac{L}{W}\right)_{M51} + \mu_{M52}\left(\frac{L}{W}\right)_{M52}} = \frac{\Delta Vcc (Rds_{(ON)M52})}{(Rds_{(ON)M52} + Rds_{(ON)M51})} \qquad \text{(Eqn. 4)}$$

wherein $RdS_{(on)}$ is the on resistance the device, taken across the drain and source terminals and wherein the (Vgs−Vt) term has been cancelled from both numerator and denominator for clarity. In equation 4, ΔVcc represents the change in Vcc, μ represents the mobility of the majority carriers in the induced channel, L represents the length of the channel and W represents the width of the induced channel.

The equality set forth as Eqn. 4 considers M52 and M51 to be a voltage divider circuit where M52 and M51 are configured as "active resistors". The increase in the voltage at node 1 results in an increase in the gate to source voltage Vgs of M53 since Vcc has increased relatively more than node 1. This reduces the on resistance of M53, drives $Ids_{M53}$ higher and increases Vref. Thus, to control Vref, $VgS_{M53}$ is controlled, thus raising or lowering the on resistance of M53. Conversely, for decreasing Vcc, $Vgs_{M53}$ is decreased, the on resistance of M53 is increased, and Vref is reduced.

A similar analysis may be carried out for the alternative embodiment of the reference voltage generator of FIG. 10, by which it can be shown that the Vref generated by the circuit of FIG. 10 Vref tracks changes in Vcc by an amount equal to some fraction of the change in the Vcc voltage.

Compensating for Vcc variations by modulating the Ids in the pull-up and pull-down paths by means of a reference voltage that tracks changes in Vcc results in an input buffer having a trip point of increased stability over variations in supply voltage. However, it is also desirable to generate a reference voltage that will increase the stability of the DC trip point of the input buffer relative to CMOS process skew such as Poly CD, FOM CD or Vt adjust. Such a stable reference voltage finds utility not only in the input buffer according to the present invention shown in FIG. 4, but also in any application wherein process skew compensation is desired.

2. Process Skew Compensation

With reference to FIG. 5, at the fs corner (fast p channel devices and slow n channel devices), the reference voltage generator circuit operates as follows. Since the p channel transistors are faster than the n channel transistors, the p channel devices have less resistance than the n channel devices. M52 has a lower resistance, hence the Node 1 voltage is reduced, thus increasing the Vgs for M53 and, in addition, since M53 is fast, greater Ids flows through M53, which raises Vref As Vref rises, M49 and M50 of FIG. 4 are driven harder, giving the M49 and M50 path greater pull-down strength. Simultaneously, however, the larger Vref tends to turn off M48, M47 and M41, causing them to conduct less pull-up current. This is the desired compensation for the fs corner, since at the fs corner the inverter stage M42 and M43 will have a higher than nominal trip point, owing to the faster p channel and slower n channel transistors.

At the sf corner (slow p channel and fast n channel devices), the inverse functionality occurs. With reference to FIG. 5, Vgs for M53 falls, as M53 now has a greater resistance than nominal, thus reducing Vref. A smaller Vref drives the compensating pull-up path of FIG. 4 including M48, M47 and M41 harder, and tends to reduce the conductivity of M49 and M50, the pull-down transistors in the compensating pull-down path. This is precisely what is required to compensate for slower than nominal p channel and faster than nominal n channel devices, as the first inverter stage including M42 and M43 of FIG. 4 will tend to have a lower than nominal DC trip point.

At the ss corner, the n and p channel transistors should become slower simultaneously and the Ids for the pull and pull-down paths should be matched. The DC trip point at the ss corner, therefore, should remain stable. At the ff corner, the n and p channel transistors should become faster simultaneously and the Ids for the pull and pull-down paths should be matched. The DC trip point at the ff corner, therefore, should also remain stable.

The alternative embodiment of the reference voltage generator shown in FIG. 10 behaves in a similar manner, as does the embodiment shown in FIG. 5, with respect to process skew. The fs corner will be discussed first. Since, at the fs corner, the p channel transistors are faster than the n channel transistors, the p channel devices have less resistance than the n channel devices. M1020, therefore, has a lower resistance, hence the Node 1 voltage is reduced, thus reducing the Vgs for M1300. In addition, since n channel M1300 is slow, less Ids flows through M1300, and more Ids flows through M1400, which raises Vref At the sf corner, the opposite occurs. At the sf corner, the p channel transistors are slower than the n channel transistors and the p channel devices have more resistance than the n channel devices. M1020, therefore, has a higher resistance, hence the node 1 voltage is increased, thus increasing the Vgs for M1300. In addition, since n channel M1300 is fast and M1400 slow, more Ids flows through M1300, and less Ids flows through M1400, which lowers Vref. This is the desired compensation, as explained relative to FIG. 5.

3. Design Considerations, Reference Voltage Generating Circuit

The design of the reference voltage generating circuit of FIG. 5 maximizes the voltage swing of the output signal Vref about the nominal DC trip point, over process corners and Vcc variations. Whereas the design of many CMOS circuits might seek to minimize the effects of process skew, the design of the reference voltage generating circuit, one embodiment of which is shown in FIG. 5, is designed to be highly responsive to process corners. Indeed, this Vref voltage swing affords the maximum compensation for the compensating pull-up path including M41, M47 and M48 and the compensating pull-down path including M49 and M50. In particular, devices M47 and M50 are highly sensitive to the gate bias provided by Vref. The output voltage Vref of the reference voltage generating circuit of FIG. 5 is designed to be centered about a DC trip point of, for example, about Vcc/2 for the nominal case (typical Vcc, p and n channel devices typical) and to swing to its maximum and minimum values at the process corners.

To do this, M51 and M52 may be selected such that node 1 is Vcc/2 in the nominal case. The channel lengths L of M51 and M52 may be chosen to be minimum for the manufacturing process utilized, as this enhances device sensitivity to the process corners. This is because Ids is sensitive to channel length, and making long channel lengths would reduce M51 and M52's sensitivity to the polysilicon linewidth. Thus, for good compensation, it is desirable to make M51 and M52 sensitive to polysilicon linewidth so that Vref may be sensitive to process skew corners. A minimum channel width accomplishes that goal. For example, if a 0.35 micron CMOS process is utilized, the channel widths of M51 and M52 may be about 0.35 microns.

M51 and M52 may be diode connected and may be considered to be first and second resistive devices, as they are connected with their gates and sources shorted and operate in saturation mode at all times. They are thus configured as "active resistors", and the voltage at node 1 (e.g. the compensation signal provided by the first compensation circuit including M51 and M52) is a function of the ratio of the resistances of M51 and M52. M51 and M52 may be considered to be a first compensation circuit. The n channel device M51 may connected to Vcc, while the p channel may connected to ground, since this gives the desired skew of node 1 for the fs and sf corners. In this manner, at the sf corner, node 1 is increased and at the fs corner, Node 1 is reduced. To choose the channel widths of M51 and M52, the following analysis may be carried out. For Vref=Vcc/2 at the nominal case, $Ids_{M51}$ should equal $Ids_{M52}$. Therefore, $$Ids_{M51} = Ids_{M52} \qquad \text{(eqn. 5)}$$

Therefore, equating the expressions for saturation currents yields $$\frac{1}{2}\mu_n C_{ox} \frac{W_n}{L_n}(V_{gsn} - |V_{tn}|)^2 = \frac{1}{2}\mu_p C_{ox} \frac{W_p}{L_p}(V_{gsp} - |V_{tp}|)^2 \qquad \text{(Eqn. 6)}$$

$$\mu_n \frac{W_n}{L_n}(V_{gsn} - |V_{tn}|)^2 = \mu_p \frac{W_p}{L_p}(V_{gsp} - |V_{tp}|)^2 \qquad \text{(Eqn. 7)}$$

and, if Vgs is assumed to be Vcc/2, $$\frac{\frac{W_n}{L_n}}{\frac{W_p}{L_p}} = \frac{\mu_p \left(\frac{V_{cc}}{2} - |V_{tp}|\right)^2}{\mu_n \left(\frac{V_{cc}}{2} - |V_{tn}|\right)^2} \qquad \text{(Eqn. 8)}$$

$$\frac{\frac{W_n}{L_n}}{\frac{W_p}{L_p}} = \frac{\mu_p}{\mu_n} \qquad \text{(Eqn. 9)}$$

Equation 9 is obtained by canceling the squared terms from both numerator and denominator. Vtn and Vtp may not be exactly equal in magnitude. Moreover, the body effect is also a factor, since the sources side of both M51 and M52 are connected to Vout, which is some positive magnitude. However, these factors may be ignored, for the purpose of establishing the approximate sizes of $W_{51}$ and $W_{52}$. Assuming $|Vt_n|=|Vt_p|$, and $\mu_n=2.7\mu_p$, which is approximately true for most CMOS processes, Equation 9 becomes:

$$\frac{\frac{W_n}{L_n}}{\frac{W_p}{L_p}} = \frac{\mu_p}{\mu_n} = \frac{1}{2.7} \qquad \text{(Eqn. 10)}$$

To achieve a voltage at Node 1 of Vcc/2, the width of M52 may be chosen to be about twice that of M51. The presence of the body effect and the Vt differences between p and n channel devices entails some deviation from the 1/2.7 ratio calculated above in order to achieve a node 1 voltage of Vcc/2. The width of M51 may be about 5 μm, since for analog circuits, it is not desirable to use devices having widths less than about 3 to about 5 μm. This is because transistors having widths less than about 3 to about 5 μm may suffer from narrow channel effects, which may be poorly modeled and more difficult to accurately predict, or may suffer from excessive sensitivity to FOM CD. As the width W of M51 may be chosen to be about 5 μm, the width W of M52 may be chosen to be about 10 μm (i.e. 2.7×5μ, adjusted for n channel and p channel differences, from eqn. 10). The channel lengths L may be minimum, for both M51 and M52. For a 0.35 μm process, for example, the W/L parameter for M51 may be about 5/0.35 and the W/L parameter for M52 may be about 10/0.35.

Transistor M53 of the reference voltage generating circuit of FIG. 5 may be biased in saturation mode, while series transistors M54 and M55 connected thereto may be biased in the linear region during normal operation. M54 and M55 may be a single active device having a W parameter of 1.5 μm, for example, or may preferably be two series connected active devices having W parameters of 3 μm. Together, M53 and the series connected M54 and M55 transistors may be considered to be a second compensation circuit. The reason for placing two n channel devices in series is to increase the on resistance while maintaining reasonably wide channels (i.e. $\geq 3$ μm), for the reasons previously mentioned, such as sensitivity to FOM CD, narrow width effects, etc. It is desirable to match the on resistance of M53 and the combined resistance of n channels M54 and M55 at the nominal bias conditions. Deviations therefrom are then caused by variations in Vcc and process skew, which provides the compensation functionality of Vref The sizes of M53, M54 and M55 may be calculated as follows.

To calculate the relative sizes of M53, M54 and M55 when Vref is to be set at Vcc/2 for the nominal setting, the ratio of the sizes of the p channel device M53 to the n channel devices M54 and M55 should be determined. In the equations below, the transistors M54 and M55 will be treated collectively and be named M54-55. As M54-55 operates in the linear region and M53 in the saturation region, the Ids equations for linear and saturation mode operation are set forth below.

Linear region operation, $$Ids = \beta\left((V_{gs} - V_t)V_{ds} - \frac{V_{ds}^2}{2}\right) \qquad \text{(Eqn. 11)}$$

(Eqn. 11)

Saturation region operation; $Ids = \beta/2(V_{gs}-V_t)^2$ (Eqn. 12)

where $\beta = \mu C_{ax} W/L$ $$I_{dsM54-55} = \beta_{M54-55}\left((V_{cc} - V_{tn})\frac{V_{cc}}{2} - \frac{\left(\frac{V_{cc}}{2}\right)^2}{2}\right) \qquad \text{(Eqn. 13)}$$

$$I_{dsM53} = \frac{\beta_{M53}}{2}(V_{cc} - V_{in} - |V_{tp}|)^2 \qquad \text{(Eqn. 14)}$$

Equating the currents in M53 with that in M54–M55, from Kirckoff's Current Law, yields $$(V_{cc} - V_{tn})\frac{V_{cc}}{2} - \frac{V_{cc}^2}{8} = \frac{\beta_{M53}}{2\beta_{M54-55}}(V_{cc} - V_{in} - |V_{tp}|)^2 \qquad \text{(Eqn. 15)}$$

$$\frac{\beta_{M53}}{\beta_{M54-55}} = \frac{(V_{cc} - V_{in})\frac{V_{cc}}{2} - \frac{V_{cc}^2}{8}}{(V_{cc} - V_{in} - |V_{tp}|)^2} \qquad \text{(Eqn. 16)}$$

$$\frac{\left(\frac{W}{L}\right)_{M53}}{\left(\frac{W}{L}\right)_{M54-55}} = 2\frac{\mu_n}{\mu_p}\left(\frac{(V_{cc} - V_{in})\frac{V_{cc}}{2} - \frac{V_{cc}^2}{8}}{\left(V_{cc} - \frac{V_{cc}}{2} - |V_{tp}|\right)^2}\right) \qquad \text{(Eqn. 17)}$$

Substituting for the values of the process (Vcc≈3.3V; $V_{tn}$≈0.87V; $V_{tp}$≈-0.8 and $\mu_n/\mu_p$≈2.7 yields (W/L)$_{M53}$/(W/L)$_{M54-M55}$≈13. Since it is desirable to minimize Icc, the active current, the n channel device M54-55 may be minimized in size. For adequate analog characteristics, W=3 μm is as small as advisable without incurring undesirable and poorly modeled narrow channel effects and undue dependence on the FOM dimensions. Hence W of M54-44 may be set at about 1.5, which is equal to a series combination of WM54=3 µm and WM55=3 µm, and WM53 may be set to about 13×1.5=20 µm, from eqn. 17.

The dimensions of the circuit elements of FIG. 10 may be chosen in a similar manner as were the dimensions of the circuit elements of FIG. 5.

The values of Node 1 and Vref were assumed, in the description above, to be Vcc/2 for the nominal bias point. However, the present invention is not to be limited thereto. Indeed, the value of Vcc/2 may require adjustment in order to "center" the swing of Vref over Vcc and process corners. Since each process has its own manufacturing characteristics, and the corners will differ from one technology to another, Vref should be examined over the process corners and the voltage at node 1 should be adjusted accordingly such that Vref has maximum excursions (both positive and negative excursions from the nominal bias point) in response to the corner models.

Figure 9:
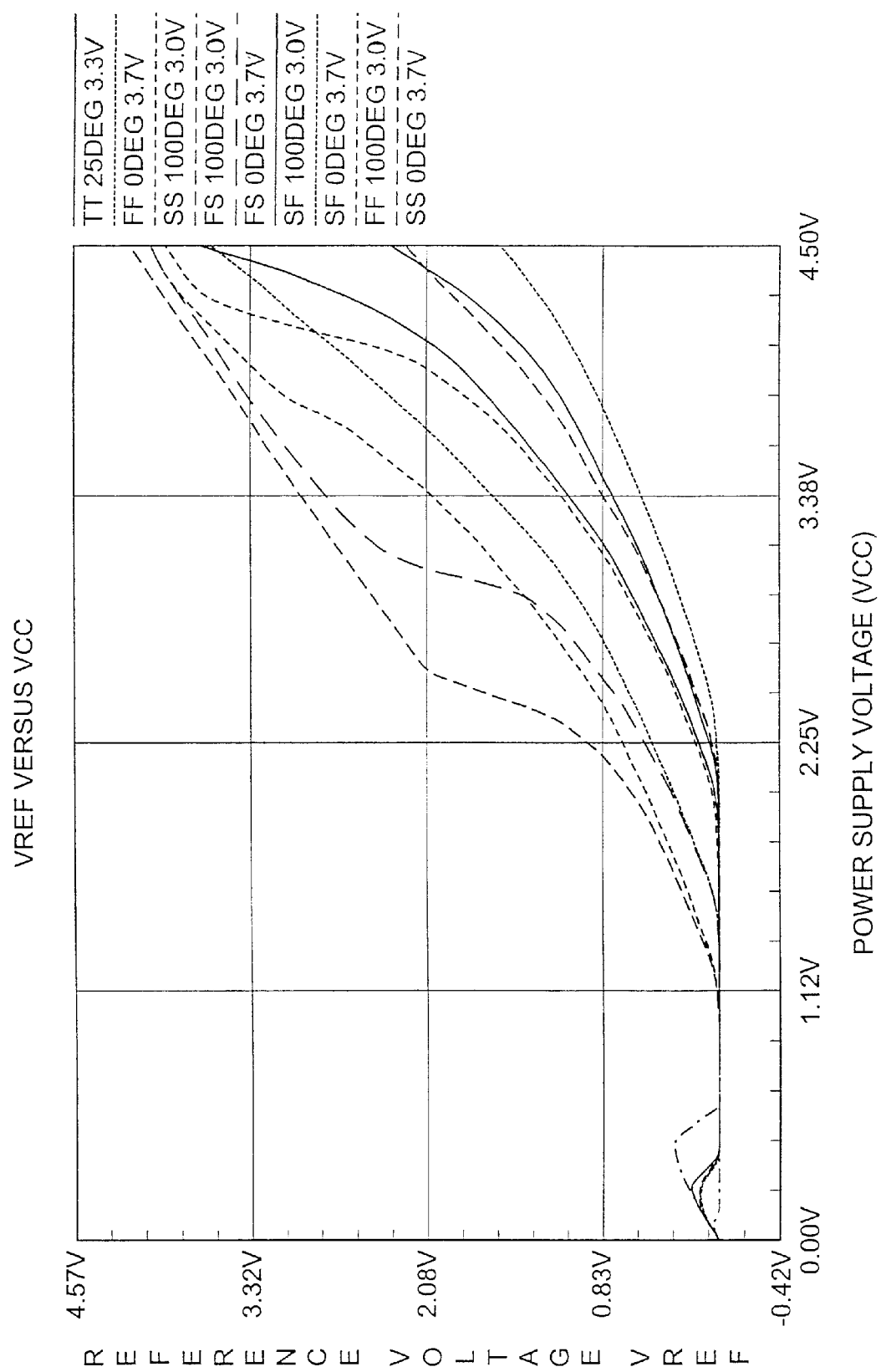
FIG. 9 is a graph of the reference voltage Vref plotted against the power supply voltage Vcc for various supply voltages, temperatures and process corners.

FIG. 9 shows a graph of the reference voltage Vref plotted against the power supply voltage Vcc, for various process corners and temperatures. As can be seen, the reference voltage Vref varies over process corners and Vcc in the manner discussed herein, to compensate at least for supply voltage variations and process skew.

4. Design Considerations, Input Buffer Circuit

The input buffer shown in FIG. 4 comprises a first inverter stage including transistors M42 and M43, a compensating pull-up path including transistors M41, M47 and M48, and a compensating pull-down path including transistors M49 and M50. The sizes of M49 and M50 may be determined such that the resistance of the compensating pull-down path may be about the same as the resistance of transistor M43 forming the pull-down path of the first inverter stage, while the resistance of the compensating pull-up path may be approximately two times the resistance of M42 forming the pull-up path of the first inverter stage. As such, the current flowing through the compensating pull-down path including devices M49 and M50 may be about the same as that flowing through the pull-down path of the first inverter stage, while the current flowing through the compensating pull-up path may be about one half that flowing through the pull-up path of the primary inverter stage. These ratios have been established experimentally, and exhibit good performance and good compensation over Vcc range and process corners. The present invention, therefore, is not to be limited to the ratios set forth above, relative to the resistance ratios between the compensating pull-up and pull-down paths and the pull-up and pull-down paths of the first inverter stage, respectively. Indeed, these resistance ratios, and hence the (W/L) parameters of the devices will vary from one technology to another and will require simulation to establish the optimum resistance ratios and device parameters.

In the embodiment of the input buffer according to the present invention shown in FIG. 4, the combination of the first inverter stage and the compensating pull-up and pull-down paths sets the DC trip point. Accordingly, the design of the first inverter stage, the compensating pull-up and pull-down paths, as well as the design of the second inverter stage may be freely changed to suit the particular application envisaged.

As shown in FIG. 4, the second inverter stage including M45 and M46 is used to equalize the ac rising and falling delays. If the first stage including transistors M42 and M43 is designed to have a stronger pull-down path to set a lower than Vcc/2 DC trip point, for example, then the pull-up path of the second stage inverter M45, M46 would be designed to be weaker than nominal and will, therefore, be slower than the pull-down path. In this example, the trip point of the second inverter stage comprising transistors M45 and M46 would be made lower to equalize the rising and falling delays at the output terminal OUT.

The following tables set forth advantageous approximate (W/L) parameters for the transistors M41–M50 of the embodiment of the input buffer according to the present invention shown in FIG. 4. Also shown are advantageous approximate (W/L) parameters for the transistors M51–M57 of the embodiment of the reference voltage generating circuit shown in FIG. 5. However, it should be noted that the W and L sizes listed below are but one of many possible implementations of the invention. Accordingly, the present invention is not to be limited to the W and L sizes disclosed herein below.

|   | W (in µm) | L (in µm) |   | W (in µm) | L (in µm) |
| --- | --- | --- | --- | --- | --- |
| INPUT BUFFER (FIG. 4) | | | | | |
| M41 | 20 | minimum* | M46 | 6 | minimum* |
| M42 | 11 | 0.8 | M47 | 14 | 1.8 |
| M43 | 7 | 0.8 | M48 | 14 | 1.8 |
| M44 | 5 | minimum* | M49 | 14 | 1.8 |
| M45 | 14 | minimum* | M50 | 14 | 1.8 |
| REFERENCE VOLTAGE GENERATING CIRCUIT (FIG. 5) | | | | | |
| M51 | 5 | minimum* | M55 | 3 | minimum* |
| M52 | 10 | minimum* | M56 | 10 | minimum* |
| M53 | 20 | minimum* | M57 | 10 | minimum* |
| M54 | 3 | minimum* | | | |

*minimum refers to the minimum channel width for the technology employed. For example, for a 0.35 µm process, the channel width W may be about 0.35 µm wherever the term "minimum*" appears in the tables. For a 0.18 µm process, the W parameter may be about 0.18 µm wherever the term "minimum*" appears in the tables.

Utilizing the circuits of FIGS. 4 and 5 in combination with the device parameters set forth above, it has been found that the DC trip point of the input buffer of FIG. 4, according to the present invention, varies only about 315 mV for Vcc variations of about 3.0V to about 3.7V, over about 0° C. to about 125° C. and over all process corners, as compared to 550 to 600 mV for conventional input buffers.

It should be noted that the input buffer of FIG. 4, although well adapted to take advantage of the Vref signal produced by the circuit of FIG. 5, is not limited to particular reference voltage generating circuit shown in FIG. 5. Indeed, the input buffer shown in FIG. 4 will operate with any reference voltage signal at its Vref terminal, provided that the reference voltage appropriately modulates the conductivity of M47 and M50 over the process corners and over the full range of Vcc variations. The structure shown in FIG. 5 is but one example of a voltage reference generating circuit that appropriately modulates the conductivity of M47 and M50, and those of skill in this art may devise other configurations without, however, departing from the scope of the present invention.

Likewise, the voltage reference generating circuits of FIGS. 5 and 10, although finding particular utility in combination with the input buffer shown in FIG. 4, are nevertheless independent thereof, and may be used wherever a reference voltage is needed that swings about a designed center point in response to process corners and Vcc variations. Therefore, although the reference voltage generating circuit is shown in combination with the input buffer shown in FIG. 4, it is by no means limited thereto.

Figure 6:
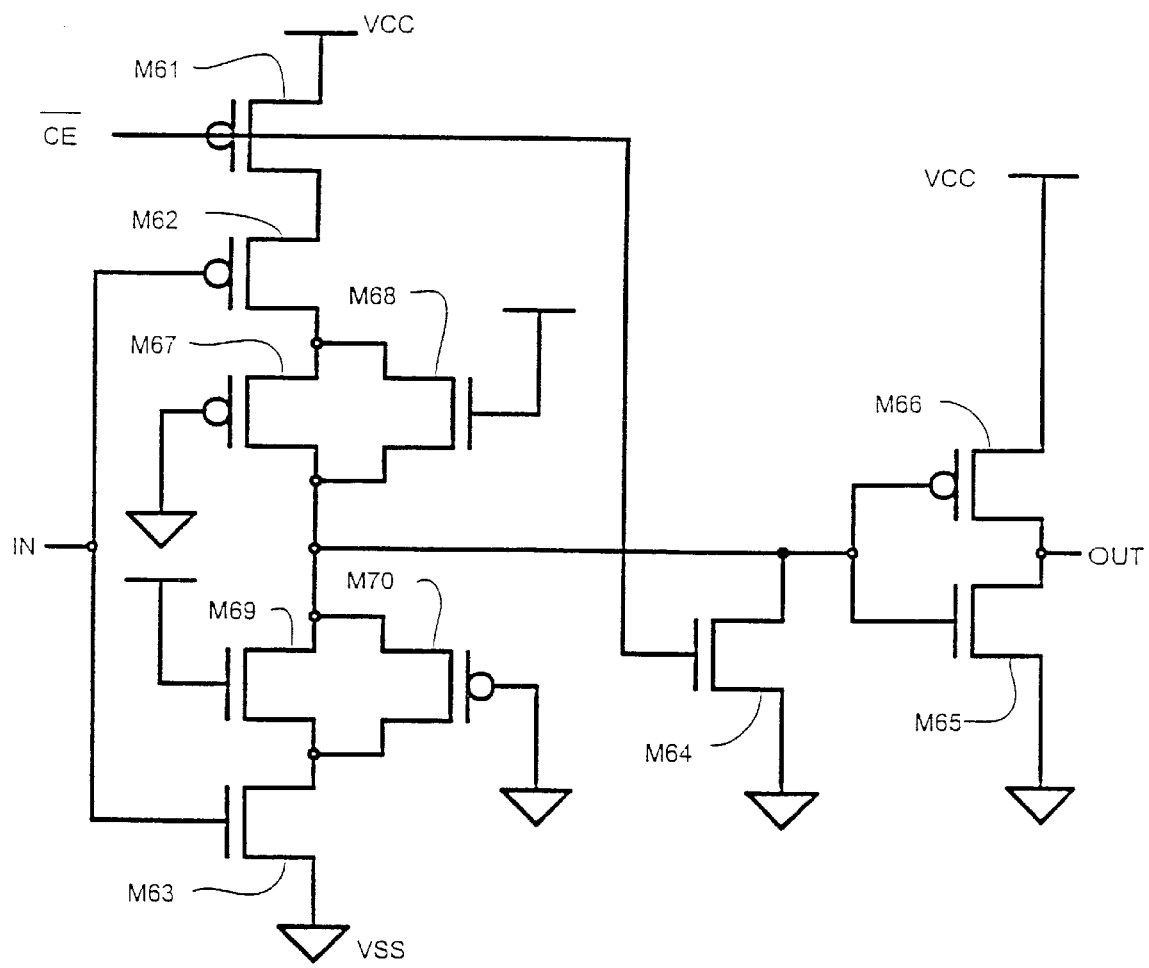
FIG. 6 is a circuit diagram of an input buffer according to another embodiment of the present invention.
Figure 7:
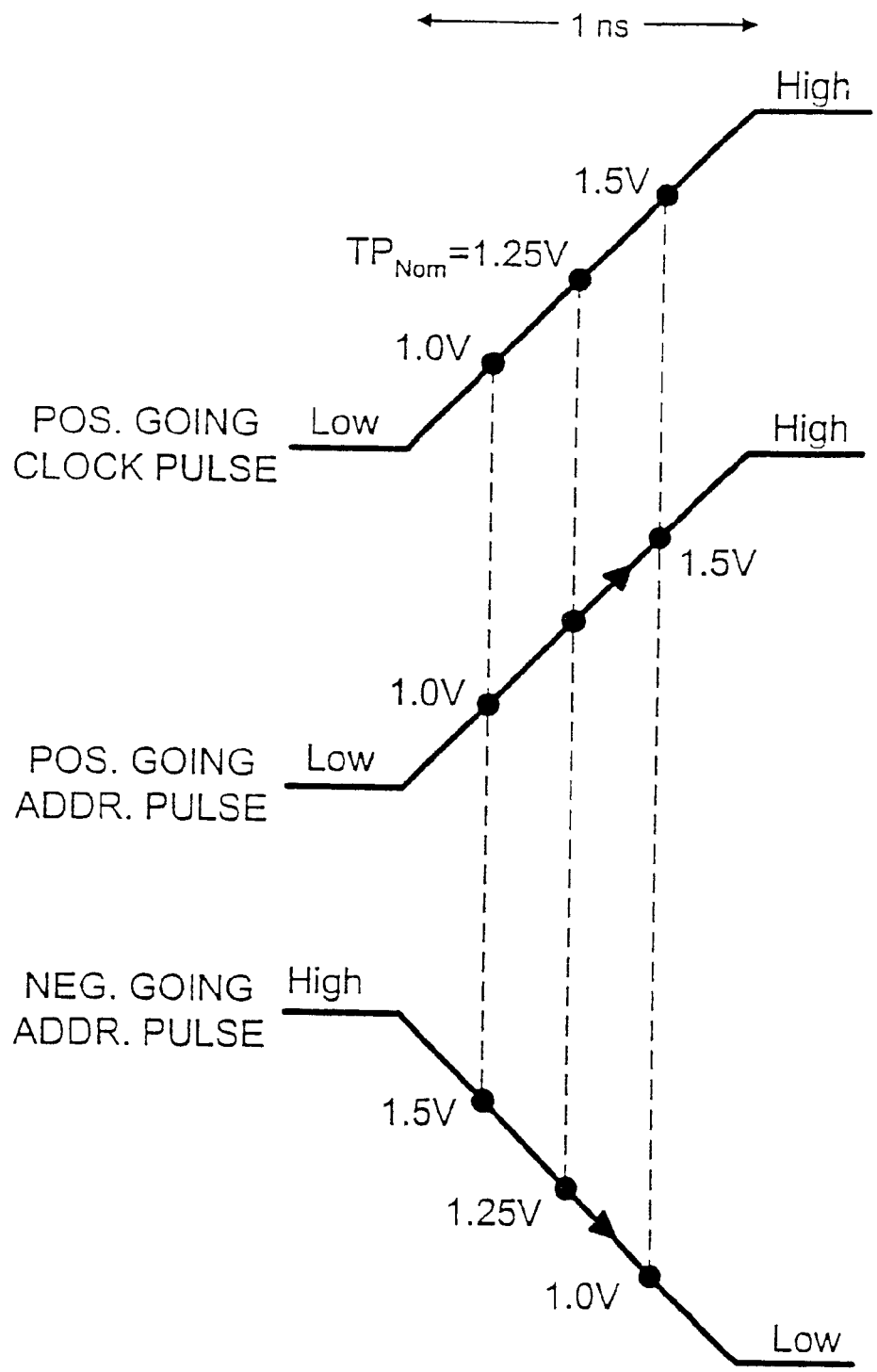
FIG. 7 is a diagram that illustrates the effects of an unstable trip point upon the Set Up and Hold window.

FIG. 6 shows another embodiment of the input buffer according to the present invention. The input buffer shown in FIG. 6 also compensates for Vcc variations and process skew, albeit not in the same manner as do the circuits of FIG. 4 and FIG. 5. The circuit of FIG. 6 comprises a control (e.g. power down) circuit including p channel transistor M61 whose source is connected to a high Vcc power supply. The gate of M61 may be controlled by a Chip Enable Bar (CEB) signal, active low. The CEB signal may also be connected to the gate of transistor M64 whose source is connected to a low voltage supply Vss or to ground. The power down circuit may be implemented as a logical NOR circuit, as shown, a logical NAND or M61 and M64 may be removed entirely from the circuit depending upon standby power and power up speed requirements.

The drain terminal of M64 is connected to the gates of M65 and M66 that form a second inverter stage. The source of M65 is connected to Vss or ground, while the source of M66 is connected to Vcc. The drains of M65 and M66 are tied together. A first inverter (e.g. input) stage includes transistors M62 and M63. P channel M62 is connected in series with M61, if M61 is present, otherwise M62 is connected to Vcc. The gate of M62 is controlled by the input signal IN. The IN signal is also connected to the gate of n channel transistor M63, whose source is connected to Vss or ground. Connected to M63 in the pull-down path in series is a first pair of transistors of opposite conductivity type connected in parallel to one another. One of the transistors of the first pair of transistors is an n channel device, whereas the other transistor of the first pair is a p channel device. The gate or control electrode of the n channel device, M69 in FIG. 6, is connected to Vcc, whereas the gate or control electrode of the p channel device, M70 in FIG. 6, is connected to Vss or ground. Connected in the pull-up path in series between the first pair of transistors and the drain terminal of M62 is a second pair of transistors of opposite conductivity type connected in parallel to one another. One of the transistors of the second pair of transistors in an n channel device M68, whereas the other transistor of the second pair is a p channel device M67. M67 and M69 may be considered to be a stabilizing circuit. The control electrode or gate of the n channel device, M68 in FIG. 6, is connected to Vcc, whereas the control electrode or gate of the p channel device, M67 in FIG. 6, is connected to Vss or ground. Connected between the first and second pairs of transistors is the drain of M64 and the gates of M65 and M66 of the second inverter stage.

The following will describe the manner in which the embodiment of the input buffer according to the present invention shown in FIG. 6 compensates for Vcc variations and for process skew.

1. Compensation for Variations in Vcc

As Vcc increases, the gate to source voltage of M67 increases, as does the gate to source voltage of M68. This raises the DC trip point of the input buffer by increasing the current in the pull-up path that includes M61, M62, M67 and M68. However, the gate to source voltage of M69 also increases with increasing Vcc. This increases the conductivity of M69 in the pull-down path including M69, M70 and M63, by reducing its on resistance, which offsets the effect of increasing Vcc on the pull-up path. Likewise, as Vcc falls below nominal (such as 3.3V, for example), the gate to source voltage Vgs of M67 falls, as well as that of M68. This decrease in Vcc, therefore, tends to lower the DC trip point of the input buffer. However, this tendency to lower the DC trip point of the input buffer with decreasing Vcc is offset by a corresponding reduction in the gate to source voltage Vgs for M69. Hence, the pull-up and pull-down strengths are compensated for variations in Vcc.

2. Process Skew Compensation

The input buffer of FIG. 6 compensates for process skew corners as follows. At the fs corner (fast p channel, slow n channel), then M67 and M70 are faster, meaning they conduct a higher than nominal Ids for a given Vgs, while M68 and M69 are slower, meaning they conduct a lower than nominal Ids for a given Vgs. Since both n channel and p channel devices are used for pull-up and pull-down, the increase in current for the p channel devices is offset by the reduction in current for the n channel. The overall pull-up and pull-down currents, therefore, remain largely unaffected by the speed differential between n and p channel devices at the fs corner. The DC trip point, therefore, is stable and substantially unaffected by the fs processing corner. Likewise at the sf corner, the slow n channel is compensated for by the faster p channel (connected in parallel for both pull-up and pull-down paths) and again the DC trip point remains stable.

All process corners are compensated for, as the presence of both n channel and p channel devices in the pull-up and pull-down paths means that any skewing of the n channel or p channel devices attributable to, for example, manufacturing processes will affect the pull-up and pull-down paths substantially equally.

The sizes of 67 and M68 may be chosen such that the switching current in the pull-up path is equally shared between the two devices. Thus, the sizes will depend upon both the linear and saturation region device characteristics of the technology in question, the threshold voltages Vt of both the n channel and the p channel devices, the body effect of the n channel and p channel, as well as the ratio of the electron and hole mobilities $\mu_n$ and $\mu_p$ of the n channel and p channel devices, respectively. N channel transistor M68 may be chosen to be about twice as large as p channel transistor M67. M68 will suffer from the body effect, since its source is connected to a node that switches from 0V to full Vcc. The parallel p channel device M67, on the other hand, will not suffer from the body effect, since its source is connected to Vcc. The body effect inflates the Vt of M68 and reduces the output conductance of the device, meaning that it reduces Ids of the device. In addition, M68 will switch OFF when its source reaches Vcc−Vtn (Vgs must be greater than Vtn, or the device is OFF) and the output of the first inverter stage is thereafter pulled high only by M67. Hence, despite the fact that the n channel mobility is greater than that of the p channel device, in order for M67 and M68 to pass equal currents during switching, M68 should be about twice the size of M67.

The selection of the sizes of M69 and M70 raises similar issues, but for the fact that M69 will not suffer from the body effect, as its source is tied to Vss or ground, while the source of M70 is connected to a node that switches from Vcc to ground. The p channel device M70 will switch OFF when the output of the first inverter stage reaches Vss+Vtp (Vgs for a p channel transistor must be less than Vtp, as Vtp is negative, or the p channel transistor is OFF). In that case, the n channel device M69 pulls the remainder of the way to ground by itself. It would be expected that the p channel M70 should be larger than the n channel M69 because of the body effect and lower carrier mobility. However, superior performance has been obtained for a weaker p channel M70, due to more consistent operation at process corners for the n channel device, for the technology in question. The design of the second inverter stage including M65 and M66 may advantageously be chosen to set equal rise and fall delays for the output node OUT.

The following table will set forth advantageous approximate (W/L) parameters for the transistors of the input buffer shown in FIG. 6. However, it should be noted that the sizes shown below are but one possible implementation, and the final choice of device dimensions will depends upon the particular application at hand as well as the implementing technology.

COMPENSATED INPUT BUFFER (FIG. 6)

| | W (in $\mu$m) | L (in $\mu$m) | | W (in $\mu$m) | L (in $\mu$m) |
|---|---|---|---|---|---|
| M61 | 35 | minimum* | M66 | 30 | minimum* |
| M62 | 80 | minimum* | M67 | 24 | 1 |
| M63 | 80 | minimum* | M68 | 40 | 1 |
| M64 | 5 | minimum* | M69 | 10 | 1 |
| M65 | 5 | minimum* | M70 | 6 | 1 |

*minimum refers to the minimum channel width for the technology employed. For example, for a 0.35 $\mu$m process, the channel width W may be about 0.35 $\mu$m wherever the term "minimum*" appears in the above table. For a 0.18 $\mu$m process, the W parameter may be about 0.18 $\mu$m wherever the term "minimum*" appears in the table.

Utilizing the circuits of FIG. 6 with the approximate device parameters set forth above, it has been found that the DC trip point of the compensated input buffer of FIG. 6, according to the present invention, varies only about 300 to 350 mV for Vcc variations of about 3.0V to about 3.7V, over about 0° C. to about 125° C. and over all process corners, as compared to 550 to 600 mV for conventional input buffers. This reduced trip point window, of course, has a beneficial effect upon the available set up and hold window, as well as upon the VIH and VIL voltage levels.

Figure 8:
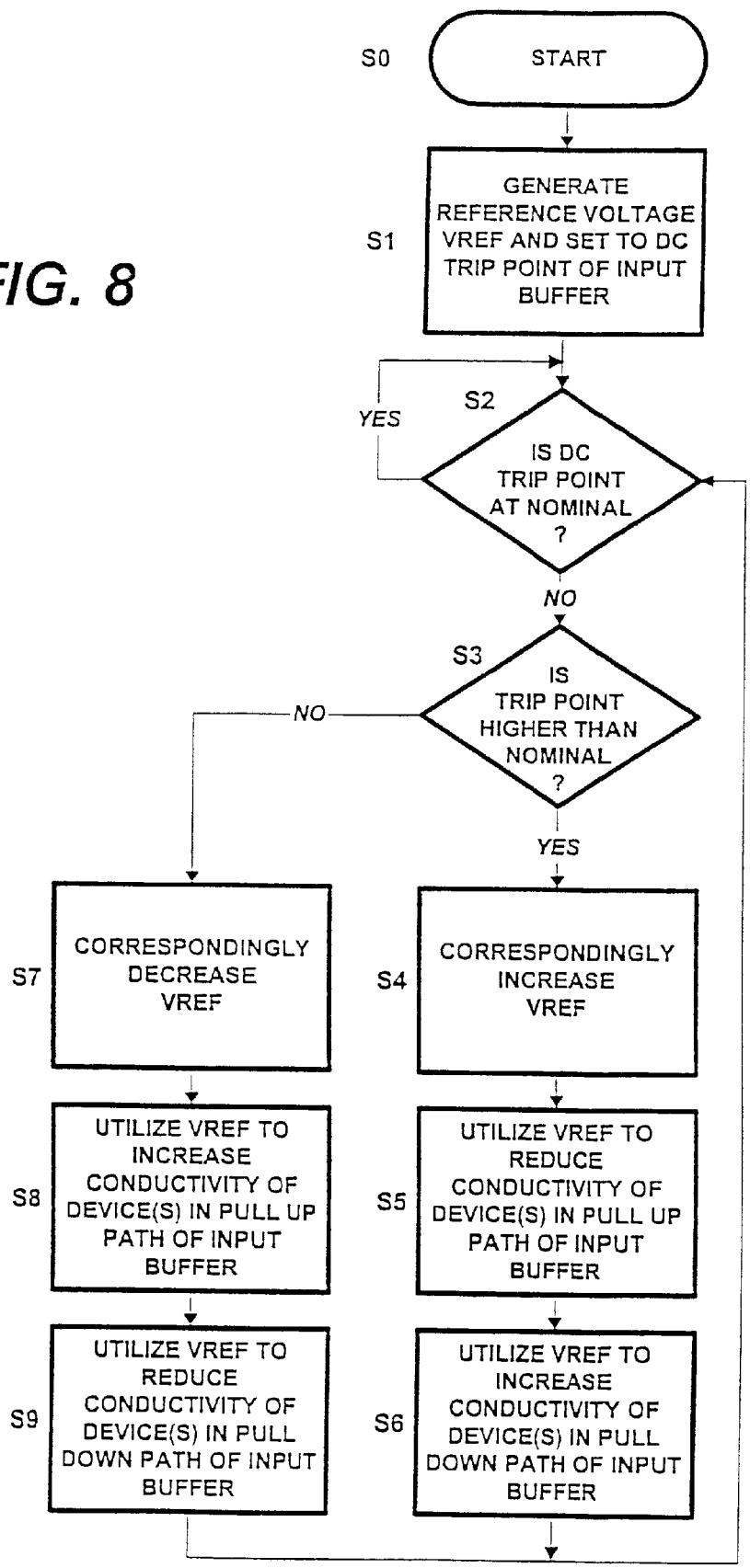
FIG. 8 is a flow chart illustrating an embodiment of a method of stabilizing an input buffer over at least supply voltage variations and process skew corners, according to the present invention.

The compensating principles detailed above may also readily be applied to a more digital process or algorithm for compensating for supply voltage variations and process skew. FIG. 8 is a flow chart illustrating such an embodiment of a method of stabilizing an input buffer over supply voltage variations and process skew, according to the present invention. The method begins at step S0. At step S1, a reference voltage Vref is generated and set to the DC trip point of the input buffer to be stabilized. An example of a suitable arrangement for generating the reference voltage Vref is shown in FIG. 5. At step S2, it is determined whether the DC trip point of the input buffer remains at the nominal trip point. If yes, the method reverts to step S2. If not, the method according to the present invention proceeds to step S3, wherein it is determined whether the DC trip point is higher than nominal. If the DC trip point of the input buffer is higher than nominal (yes branch at step S3), the Vref signal generated in step S1 is increased by a fractional amount corresponding to the increase in the DC trip point of the input buffer. In step S5, the increased Vref signal is applied to the input buffer and utilized to reduce the conductivity of at least one device in the pull-up path of the input buffer, thereby decreasing the current in the pull-up path. Simultaneously, the correspondingly increased Vref signal, in step S6, is utilized to increase the conductivity of at least one device in the pull-down path of the input buffer, thereby increasing the current in the pull-down path. The method then reverts to step S2, wherein it is determined whether the DC trip point of the input buffer is at nominal.

If it is determined that the DC trip point is not at nominal and is not higher than nominal, in steps S2 and S3, respectively, then the DC trip point of the input buffer must be lower than nominal. In that case, the reference voltage generated in step S1 is decreased, in step S7, by a fractional amount corresponding to the decrease in the DC trip point of the input buffer. In step S8, the decreased Vref is utilized to increase the conductivity of at least one device in the pull-up path, thereby increasing the current in the pull-up path of the input buffer. Simultaneously, the correspondingly decreased Vref signal, in step S9, is utilized to reduce the conductivity of at least one device in the pull-down path of the input buffer, thereby decreasing the current in the pull-down path. The method then reverts to step S2, wherein it is determined whether the DC trip point of the input buffer is at nominal. In this manner, the DC trip point of the input buffer is stabilized by modulating the conductivity of at least one device in the pull-up path and at least one device in the pull-down path of the input buffer.

While the foregoing detailed description has described preferred embodiments of the present invention, it is to be understood that the above description is illustrative only and not limiting of the disclosed invention. For example, the design of the input buffers and the reference voltage generator disclosed herein may be adapted to other technologies, and the device dimensions disclosed herein may be adapted to the particular application envisaged without, however, departing from the spirit and scope of the present invention. Moreover, the input buffer disclosed herein may be utilized with the reference voltage generator disclosed herein, or with a reference voltage generating circuit of another design. Further modifications will occur to those of skill in this art, and all such modifications are deemed to fall within the scope of the present invention. Thus, the present invention is to be limited only by the claims as set forth below.

What is claimed is:

1. A buffer circuit, comprising:
   an input stage, comprising at least one input node receiving a first signal, a first pull-up transistor, a first pull-down transistor, and an output node;
   a control circuit configured to (i) couple said first pull-up transistor to a first supply voltage and/or decouple said first pull-up transistor from said first supply voltage, (ii) couple said output node to a second supply voltage and/or decouple said output node from said second supply voltage, or (iii) both (i) and (ii);
   a stabilizing circuit comprising (i) a first p-channel transistor in a pull-up path and (ii) a first n-channel transistor in a pull-down path, each being independently coupled to at least one source/drain terminal of at least one of said first pull-up transistor and said first pull-down transistor, wherein said stabilizing circuit is configured to (i) increase a pull down current through said source/drain terminal of said first pull-down transistor in response to a reference signal, (ii) decrease a pull down current through said source/drain terminals of said pull-down transistor in response to said reference signal, or (iii) both (i) and (ii); and
   a reference voltage generating circuit configured to (a) generate said reference voltage and (b) compensate for at least (i) variations in said first supply voltage and/or said second supply voltage, (ii) variations caused by process skew, or (iii) both (i) and (ii), by varying said reference voltage in response thereto.

2. The buffer circuit of claim 1, wherein said reference voltage generating circuit comprises:
   a control circuit configured to couple a first supply voltage to a first node in response to a control signal;

a first compensation circuit comprising a first p-channel device and a first n-channel device defining a second node therebetween, said first compensation circuit providing a compensation signal at said second node in response to (i) a second supply voltage and (ii) a signal at said first node; and a second compensation circuit comprising a second p-channel device and a second n-channel device defining an output node therebetween, said second compensation circuit providing a reference voltage at said output node in response to (i) one of said first and second supply voltages, (ii) said signal at said first node, and (iii) said compensation signal.

3. The reference voltage generating circuit of claim 1, wherein one of said second p-channel device and said second n-channel device is configured as a resistive device, and the other of said second p-channel device and said second n-channel device comprises a transistor having a gate receiving said compensation signal.

4. An apparatus comprising:

a control circuit configured to couple a first supply voltage to a first node in response to a control signal;

a first compensation circuit providing a compensation signal at a second node in response to (i) a second supply voltage and (ii) a signal at said first node;

a second compensation circuit providing a reference voltage at a third node in response to (i) at least one of said first and second supply voltages, (ii) said signal at said first node, and (iii) said compensation signal; and a buffer circuit configured to generate an output signal in response to an input signal, said control signal and said reference voltage.

5. The apparatus according to claim 4, wherein said buffer circuit comprises:

an input stage, comprising at least one input node receiving said input signal, a pull-up path, a pull-down path, and an output node presenting said output signal;

a second control circuit configured to couple (i) said pull-up path to said second supply voltage and (ii) said output node to said first supply voltage in response to said control signal; and a stabilizing circuit configured to vary a conductivity of said pull-up path and a conductivity of said pull-down path in response to said reference voltage.

6. The apparatus according to claim 5, wherein said stabilizing circuit is configured to:

increase said conductivity of said pull-up path and decrease said conductivity of said pull-down path in response to a trip point of said buffer circuit falling below a predetermined value; and decrease said conductivity of said pull-up path and increase said conductivity of said pull-down path in response to said trip point of said buffer circuit rising above said predetermined value.

7. The apparatus according to claim 5, wherein:

said input stage comprises (i) a first pull-up transistor disposed in said pull-up path and (ii) a first pull-down transistor disposed in said pull-down path; and said stabilizing circuit comprises (i) a first p-channel transistor in said pull-up path and (ii) a first n-channel transistor in said pull-down path, each being independently coupled to at least one source/drain terminal of at least one of said first pull-up transistor and said first pull-down transistor.

8. The apparatus according to claim 7, wherein:

said input stage further comprises (i) a second pull-up transistor disposed in said pull-up path and (ii) a second pull-down transistor disposed in said pull-down path.

9. The apparatus according to claim 4, wherein:

said first compensation circuit comprises a first p-channel device and a first n-channel device defining said second node therebetween; and said second compensation circuit comprises a second p-channel device and a second n-channel device defining said third node therebetween.

10. The apparatus according to claim 9, wherein:

one of said first p-channel device and said first n-channel device is configured as a resistive device, and the other of said first p-channel device and said first n-channel device is configured as a diode.

11. The apparatus according to claim 9, wherein:

one of said second p-channel device and said second n-channel device is configured as a resistive device, and the other of said second p-channel device and said second n-channel device comprises a transistor having a gate receiving said compensation signal.

12. The apparatus according to claim 9, wherein said second compensation circuit further comprises:

a third n-channel device coupling said second n-channel device and said first node.

13. The apparatus according to claim 5, wherein said buffer circuit further comprises:

an output stage configured to receive said output signal.

14. A method for stabilizing a trip point of a buffer over variations in supply voltage and/or processing, said buffer comprising a pull-up path and a pull-down path, each path having a conductivity, said method comprising the steps of:

generating a signal at a first node in response to (i) a first supply voltage and (ii) a first state of a control signal;

generating a compensation signal in response to (i) said signal at said first node and (ii) a second supply voltage; and generating a reference voltage in response to (i) one of said first and second supply voltages, (ii) said signal at said first node, and (iii) said compensation signal; and modulating at least one of said conductivities in response to a change in said reference voltage.

15. The method according to claim 14, further comprising the steps of:

coupling (i) said pull-up path to said second supply voltage and (ii) an output node to said first supply voltage in response to said control signal.

16. The method according to claim 14, wherein the modulating step comprises:

increasing said conductivity of said pull-up path and decreasing said conductivity of said pull-down path in response to said trip point of said buffer circuit falling below a predetermined value; and decreasing said conductivity of said pull-up path and increasing said conductivity of said pull-down path in response to said trip point of said buffer circuit rising above said predetermined value.

17. The method according to claim 14, further comprising the step of:

pulling said reference voltage toward said second supply voltage in response to a second state of said control signal.

18. The method according to claim 14, wherein the reference voltage generating step comprises:

controlling a pull-up device in response to said compensation signal.

19. The method according to claim 14, wherein the reference voltage generating step comprises:

controlling a pull-down device in response to said compensation signal.

20. The method of claim 14, further comprising the step of generating said compensation signal via a p-channel device and an n-channel device configured as resistive and/or diode-connected devices.

* * * * *